United States Patent
Sakimura et al.

(10) Patent No.: US 8,872,542 B2
(45) Date of Patent: Oct. 28, 2014

(54) SEMICONDUCTOR DEVICE AND SEMICONDUCTOR DEVICE CONTROL METHOD

(75) Inventors: Noboru Sakimura, Tokyo (JP); Munehiro Tada, Tokyo (JP); Toshitsugu Sakamoto, Tokyo (JP); Ryusuke Nebashi, Tokyo (JP)

(73) Assignee: NEC Corporation, Tokyo (JP)

( * ) Notice: Subject to any disclaimer, the term of this patent is extended or adjusted under 35 U.S.C. 154(b) by 41 days.

(21) Appl. No.: 13/825,243

(22) PCT Filed: Sep. 21, 2011

(86) PCT No.: PCT/JP2011/071451
§ 371 (c)(1),
(2), (4) Date: Mar. 20, 2013

(87) PCT Pub. No.: WO2012/039415
PCT Pub. Date: Mar. 29, 2012

(65) Prior Publication Data
US 2013/0181739 A1    Jul. 18, 2013

(30) Foreign Application Priority Data

Sep. 21, 2010    (JP) ................................. 2010-210984

(51) Int. Cl.
*H03K 19/177* (2006.01)
*G11C 13/00* (2006.01)
*H03K 19/02* (2006.01)
*G11C 29/02* (2006.01)

(52) U.S. Cl.
CPC ...... *H03K 19/17748* (2013.01); *G11C 13/0004* (2013.01); *G11C 13/0007* (2013.01); *G11C 13/0033* (2013.01); *G11C 13/0035* (2013.01); *G11C 13/0069* (2013.01); *G11C 2013/0073* (2013.01); *H03K 19/02* (2013.01); *G11C 29/021* (2013.01); *G11C 29/028* (2013.01)
USPC .............................................. 326/38; 326/41

(58) Field of Classification Search
CPC .............. H03K 19/177; H03K 19/173; H03K 19/17748
USPC ...................................................... 326/37–41
See application file for complete search history.

(56) References Cited

U.S. PATENT DOCUMENTS

| 6,831,872 B2 | 12/2004 | Matsuoka |
| 6,967,867 B2 | 11/2005 | Hamaguchi |

(Continued)

FOREIGN PATENT DOCUMENTS

| JP | 2004-185745 | 7/2004 |
| JP | 2004-185753 A | 7/2004 |

(Continued)

*Primary Examiner* — Don Le
(74) *Attorney, Agent, or Firm* — Foley & Lardner LLP

(57) ABSTRACT

A semiconductor device comprises: reconfigurable logic circuit that includes plurality of resistance change elements; logical configuration of the reconfigurable logic circuit being decided depending on whether each of plurality of resistance change elements is in first resistance state or in second resistance state whose resistance value is lower than resistance value of first resistance state; resistance value monitor circuit that includes resistance change element pre-programmed to the first resistance state; the resistance value monitor circuit detecting whether or not pre-programmed resistance change element retains the first resistance state; and controller that, in case it is detected that resistance change element provided in resistance value monitor circuit doe not retain first resistance state, applies voltage used in programming from second resistance state to first resistance state to resistance change element retaining first resistance states, out of plurality of resistance change elements provided in reconfigurable logic circuit.

13 Claims, 11 Drawing Sheets

(56) References Cited

U.S. PATENT DOCUMENTS

| | | |
|---|---|---|
| 7,236,388 B2 | 6/2007 | Hosoi et al. |
| 7,580,277 B2 | 8/2009 | Fuji |
| 7,751,227 B2 | 7/2010 | Fuji |
| 8,294,489 B2 | 10/2012 | Tanamoto et al. |
| 8,674,724 B2 * | 3/2014 | Nazarian et al. ............ 326/44 |
| 2006/0158948 A1 | 7/2006 | Fuji |
| 2008/0211539 A1 * | 9/2008 | Parkinson ................ 326/41 |
| 2010/0091561 A1 * | 4/2010 | Lowrey et al. ............ 365/163 |
| 2012/0112788 A1 * | 5/2012 | Lung ..................... 326/39 |
| 2013/0215670 A1 * | 8/2013 | Oda et al. ................ 365/154 |
| 2013/0248959 A1 * | 9/2013 | Matsumoto et al. ........ 257/314 |

FOREIGN PATENT DOCUMENTS

| | | |
|---|---|---|
| JP | 2006-19444 A | 1/2006 |
| JP | 2006-202383 A | 8/2006 |
| JP | 2008-235704 A | 10/2008 |
| JP | 2010-81172 A | 4/2010 |

* cited by examiner

SEMICONDUCTOR DEVICE AND SEMICONDUCTOR DEVICE CONTROL METHOD

CROSS-REFERENCE TO RELATED APPLICATION

The application is the National Phase of PCT/JP2011/071451, filed Sep. 21, 2011, which claims the benefit of the priority derived from corresponding JP Patent Application No. 2010-210984 filed on Sep. 21, 2010, the disclosures of which are ioncorporated herein in their entirely by reference thereto.

The present invention relates to a semiconductor device and a semiconductor device control method. More particularly, it relates to a semiconductor device having a reconfigurable logic circuit (programmable logic LSI) including a built-in resistance change element as a switching element, and a control method thereof.

BACKGROUND

Researches and developments, in which a resistance change element, whose resistance value is changed depending on its physical state, is built into a semiconductor integrated circuit to expand its functions or performance, are now going on actively.

An MRAM (Magnetic Random Access Memory), for example, retains one-bit information by exploiting the property of a magnetic resistance element that its resistance is varied depending on its state of magnetization. On the other hand, a PRAM (Phase change RAM) retains one-bit information by exploiting the property of a phase change element of, for example, a chalcogenide alloy, that its resistance is varied depending on its crystal state. An RRAM (Resistive RAM) uses a metal oxide resistance change element of, for example, perovskite oxide, or a solid electrolyte resistance change clement. The RRAM exploits the property that the resistance of the resistance change elements is changed by controlling the voltage or current applied to these resistance change elements.

In the metal oxide resistance change element or in the solid electrolyte resistance change element, the ratio between the on-resistance and the off-resistance thereof is significant, varying by several orders of magnitude, as an example. Therefore, these resistance change elements may be applied not only for use in non-volatile memories, but also for freely programming truth values of logic gates to freely make or break interconnections. That is, the resistance change element may be caused to operate as a switching element for application to a non-volatile reconfigurable logic circuit (programmable logic Large Scale Integration).

To diversify the functions of the reconfigurable logic circuit to promote its implementation on electronic equipment, it is necessary to reduce the size of a switch interconnecting logic cells as well as to reduce its on-resistance. With a switch exploiting an electro-chemical reaction by solid electrolytes, it is possible to reduce the size in comparison with a CMOS (Complementary Metal-Oxide-Semiconductor) switch and, at the same time, to reduce the on-resistance by approximately one order of magnitude to, for example, ca. 100Ω, in comparison with the CMOS switch.

FIG. 10(a) to FIG. 10(d) illustrate a programming operation for a resistance change element that exploits the solid electrolyte. Referring to FIG. 10(a), a resistance change element, exploiting the solid electrolyte, is composed of a first electrode, supplying metal ions, a second electrode, not supplying metal ions, and an ion conduction layer sandwiched in-between.

Referring to FIG. 10(b), if, in applying a voltage across the two electrodes, the first electrode is set to a potential higher than the second electrode, metal is oxidized on the surface of the first electrode to metal ions which are delivered into the ion conduction layer. On the surface of the second electrode, on the other hand, the metal ions in the ion conduction layer are reduced to form metal which is precipitated.

Referring to FIG. 10(c), if a metal crosslinking reaching the surface of the second electrode from the surface of the first electrode is formed by metal precipitated, the state of conduction is changed from ionic conduction in the ion conduction layer to conduction passing through the metal crosslinking. In such case, the resistance between the two electrodes is rapidly decreased. That is, the switch shifts to an on-state (state of low resistance).

The programming operation from the off-state (high-resistance state) to the on-state in FIG. 10(b) is termed a "set operation."

Referring to FIG. 10(d), if, in the state where metal crosslinking has been formed, the first electrode is set to a potential lower than that at the second electrode, metal is oxidized to form metal ions on the metal crosslinking surface where the potential is equal to that on the surface of the second electrode. The so formed metal ions are delivered into the ion conduction layer. On the surface of the first electrode, on the other hand, the metal ions in the ion conduction layer are reduced to form metal which is precipitated. Hence, the metal crosslinking gradually becomes thinner in thickness until, at a certain time point, the path of conduction between the electrodes via the metal crosslinking is disconnected. The electrical conduction between the two electrodes is changed at this time point from the conduction state via the metal crosslinking to the ion conduction via the ion conduction layer. Hence, the resistance between the two electrodes rises abruptly. That is, the switch is turned into an on-state (state of high resistance).

Referring to FIG. 10(a), if the voltage continues to be applied across the two electrodes, the metal precipitated on the surface of the second electrode is oxidized to form metal ions, so that metal precipitated now disappears.

The programming operation from the on-state to the off-state in FIG. 10(d) is termed a "reset operation."

In the resistance change element, exploiting the solid electrolyte, switching between the "on-state" and the "off-state" is by formation and extinguishment of a conduction path via the metal crosslinking. Since the resistance change element has a simplified structure, its fabrication process is simple, such that it is possible to reduce the device size to a nanometer-order.

To overcome the problem of deterioration of a reference cell, there is disclosed in Patent Literature 1 a semiconductor memory device in which the state of the reference cell is corrected efficiently to prevent the reference cell from being deteriorated due to disturbance to maintain the reference cell at highly accurate value. On the other hand, there is disclosed in Patent Literature 2 a semiconductor device the logic operation of which is programmable and which may also operate as a non-volatile memory device.

[Patent Literature 1] JP Patent Kokai JP-A-2004-185745
[Patent Literature 2] JP Patent Kokai JP-A-2008-235704

SUMMARY

The disclosures of the above Patent Literatures are to be incorporated herein by reference. The following analysis is by the present inventor.

In order for the resistance change element, exploiting the electrochemical reaction, to operate as a make/break switch for an interconnection for a programmable logic, it is necessary to balance the decreasing programming voltage with retention characteristics at the logic operating power supply voltage. For example, in a deep sub-micron CMOS process, used in these days, the logic operating power supply voltage is on the order of 1V. It is thus desirable that an off-state can be maintained for over ten years as a 1V voltage is applied across both ends of a resistance change element in the off-state.

FIG. 11 depicts a graph showing an example programming characteristic of a resistance change element exploiting a solid electrolyte. It is noted that such a system in which the voltage in an external interface is 3.3V or 2.5V is routine and a high withstand voltage transistor therefor can be used rather easily in the programming circuit. The programming voltage is thus desirably set within a range from 3V to 5V, as shown in FIG. 11.

The device characteristics of the resistance change element may be adjusted by proper designing of the material type or the film thickness of an electrode layer or an ion conduction layer. However, there is a tradeoff between reducing the programming voltage and the long retention characteristic such that it is difficult to optimize the two simultaneously. In particular, the programming voltage and the retention characteristics are varied from one element to another and hence are difficult to optimize. For example, if the programming voltage of the total of the elements is to be lowered to ca. 3V, it may sometimes occur that retention characteristics of some of the elements in use are less than ten years. If conversely the retention characteristics of the total of the elements are set so as to be ten years or longer, it may occur that the programming voltage of certain elements is over 5V, these elements being non-programmable.

Therefore, there is a demand in the art that, in a semiconductor device provided with a reconfigurable logic circuit employing a resistance change element, retention characteristics are improved as the programming voltage is decreased.

According to a first aspect of the present invention, there is provided a semiconductor device, comprising:
a reconfigurable logic circuit that includes a plurality of resistance change elements; a logical configuration of the reconfigurable logic circuit being decided depending on whether each of the plurality of resistance change elements is in a first resistance state or in a second resistance state whose resistance value is lower than a resistance value of the first resistance state;
a resistance value monitor circuit that includes a resistance change element pre-programmed to the first resistance state; the resistance value monitor circuit detecting whether or not the pre-programmed resistance change element retains the first resistance state; and
a controller that, in case it is detected that the resistance change element provided in the resistance value monitor circuit does not retain the first resistance state, applies a voltage used in programming from the second resistance state to the first resistance state to a resistance change element retaining the first resistance states, out of the plurality of resistance change elements provided in the reconfigurable logic circuit.

According to a second aspect of the present invention, there is provided a semiconductor device control method, comprising:
deciding a logical configuration of a reconfigurable logic circuit that includes plurality of resistance change elements, depending on whether each of the plurality of resistance change elements is in a first resistance state or in a second resistance state whose resistance value is lower than a resistance value of the first resistance state;
detecting whether or not a resistance change element in a resistance value monitor circuit, pre-programmed to the first resistance state, retains the first resistance state; and
applying, in case it is detected that the resistance change element provided in the resistance value monitor circuit does not retain the first resistance state, a voltage used in programming from the second resistance state to the first resistance state to a resistance change element retaining the first resistance states, out of the plurality of resistance change elements provided in the reconfigurable logic circuit.

The present invention provides the following advantage, but not restricted thereto. In the semiconductor device and the semiconductor device control method, according to the present invention, it is possible, in a reconfigurable logic circuit that makes use of a resistance change element, to improve retention characteristics as the programming voltage is lowered.

PREFERRED MODES

Figure 1:
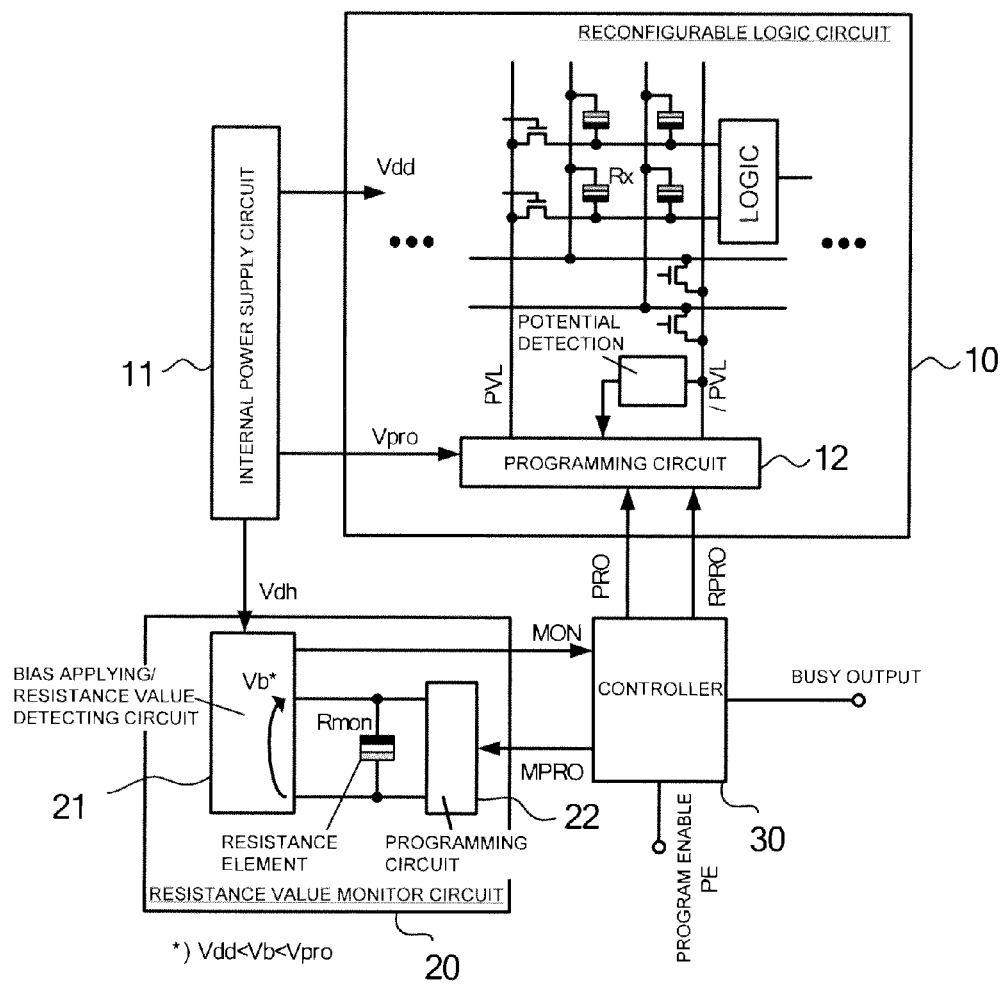
FIG. 1 is a block diagram showing an example configuration of a semiconductor device according to a first exemplary embodiment.

In the present disclousure, there are various possible modes, which include the following, but not restricted thereto.

A semiconductor device in a mode 1 may be the above mentioned semiconductor device according to the first aspect.

In a semiconductor in a mode 2, each of the plurality of resistance change elements provided in the reconfigurable logic circuit and the resistance change element provided in the resistance value monitor circuit may be programmed from the first resistance state to the second low resistance state when a first voltage is applied in a forward direction across both ends thereof, and each of the plurality of resistance change elements in the reconfigurable logic circuit and the resistance change element in the resistance value monitor circuit may be programmed from the second resistance state to the first resistance state when a second voltage is applied in a reverse direction across both ends thereof.

A semiconductor device in a mode 3 may comprise, as the resistance change element provided in the resistance value monitor circuit, a plurality of resistance change elements connected in parallel.

In a semiconductor device in a mode 4, a voltage higher than a power supply voltage of the reconfigurable logic circuit and lower than the first voltage may be applied in the forward direction across both ends of the resistance change element provided in the resistance value monitor circuit.

In a semiconductor device in a mode 5, if it is detected that the resistance change element provided in the resistance value monitor circuit does not retain the first resistance state, the controller nay apply a voltage used in programming from the second resistance state to the first resistance state to the resistance change element in the resistance value monitor circuit.

A semiconductor device in a mode 6 may further comprise:
a timer circuit that measures a cumulative time that elapses since supply power throw, wherein
the controller may apply, if the cumulative time exceeds a pre-set time, a voltage used in programming from the second resistance state to the first resistance state, to a resistance change element retaining the first resistance state out of the plurality of resistance change elements in the reconfigurable logic circuit.

In a semiconductor device in a mode 7, if the cumulative time exceeds the pre-set time, the controller may apply a voltage used in programming from the second resistance state to the first resistance state to a resistance change element retaining the first resistance state out of the plurality of resistance change elements in the reconfigurable logic circuit, even in case it has been detected that the resistance change element provided in the resistance value monitor circuit retains the first resistance state.

In a semiconductor circuit in a mode 8, the timer circuit may include a resistance change element that records information corresponding to the cumulative time when the supply power is turned off.

A semiconductor device control method in a mode 9 may be the semiconductor device control method according to the above mentioned second aspect.

According to the present invention, failures in retention of off-states (high resistance states) of the resistance change elements may be forestalled in a reconfigurable logic circuit making use of the resistance change elements. It is thus possible to improve retention characteristics of the resistance change element as well as reliability of the reconfigurable logic circuit.

(First Exemplary Embodiment)

A semiconductor device according to a first exemplary embodiment will now be described with reference to the drawings, FIG. 1 depicts a block diagram showing, as an example, a configuration of a semiconductor device according to the present exemplary embodiment. With reference to FIG. 1, the semiconductor device includes a reconfigurable logic circuit 10, a resistance value monitor circuit 20, a controller 30 and an internal power supply circuit 11.

The reconfigurable logic circuit 10 includes a plurality of resistance change elements Rx as routing switches to electrically connect or disconnect arbitrary interconnections. These resistance change elements Rx may also be used as a truth value circuit (lookup table circuit or LUT circuit) of the reconfigurable logic circuit 10. The reconfigurable logic circuit 10 also includes a programming circuit 12 that reduces or increases the resistance value of each resistance change element Rx to turn it on or off, respectively.

The resistance value monitor circuit 20 detects whether or not the resistance value of a resistance change element Rmon, programmed in advance at a high resistance state (off-state), has transitioned to a low resistance state (on-state).

The controller 30 receives a signal MON, informing it that the resistance change element Rmon being monitored has transitioned to the on-state, and searches the resistance states of the total of the resistance change elements Rx used in the reconfigurable logic circuit 10. Each time the controller 30 detects the resistance change element Rx in the off-state, the controller resets the resistance change element Rx to prevent the resistance change element Rx from being turned on. The operation to check for the resistance state of the resistance change elements to set each of the resistance change elements in the off-state to a high resistance state, by way of a re-reset operation or a re-programming operation, is termed a "refresh operation."

Figure 2:
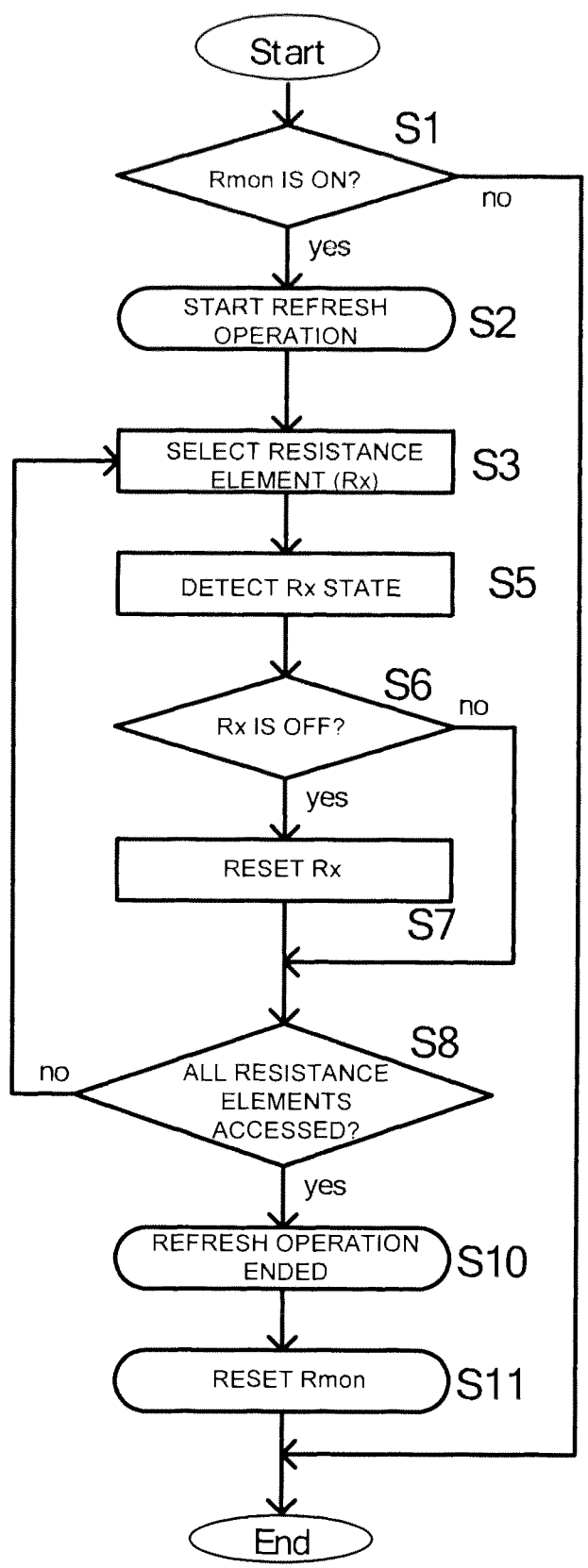
FIG. 2 is a flowchart showing an example refresh operation of the semiconductor device according to the first exemplary embodiment.

FIG. 2 depicts a flowchart showing an example refresh operation for a semiconductor device according to the present exemplary embodiment. Referring to FIG. 2, the refresh operation will be described in detail.

When the resistance change element Rmon in the resistance value monitor circuit 20 has transitioned to the on-state (Yes of step S1), the refresh operation is commenced (step S2).

The refresh operation is preferably commenced after the processing operation executed in the reconfigurable logic circuit 10 has come to a close such that the circuit is in a stand-by state. Thus, if the refresh operation is commenced, a busy signal to outside may be activated to inhibit accepting a command from outside.

The controller 30 increments an address signal, associated with each resistance change element Rx, and detects the resistance state of each resistance change element Rx to execute a reset operation (an operation to increase the resistance) of each resistance change elements Rx which is in the off-state (steps S3 to S8).

In case the resistance change element being accessed is in an on-state (No of step S6), the controller 30 accesses the next resistance change element without performing the programming operation (set/reset).

When the accessing to the total of the resistance change elements is ended (Yes of step S8), the refresh operation comes to a close (step S10). The resistance change element Rmon of the resistance value monitor circuit 20 is then reset (step S11).

Figure 3:
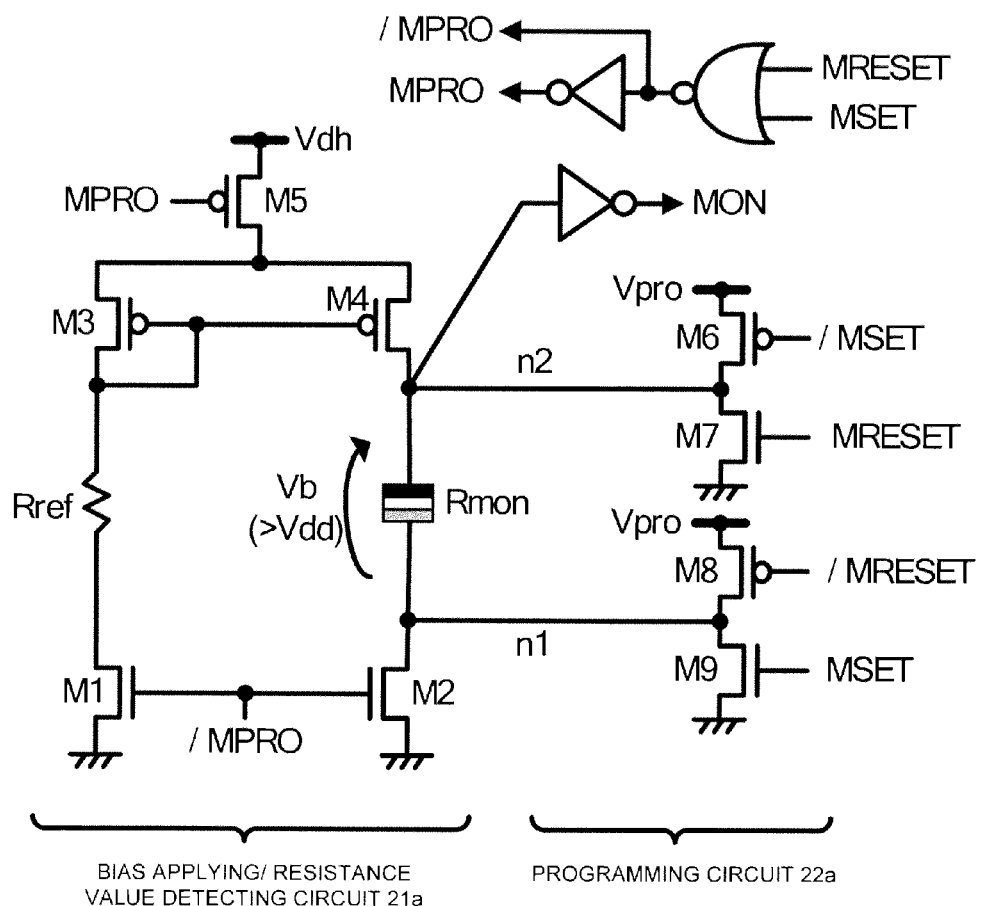
FIG. 3 is a circuit diagram showing an example configuration of a resistance value monitor circuit in the semiconductor device according to the first exemplary embodiment.

FIG. 3 depicts a circuit diagram showing an example configuration of the resistance value monitor circuit 20 in the semiconductor device of the present exemplary embodiment. With reference to FIG. 3, a resistance value monitor circuit 20a includes a resistance change element Rmon, a bias applying/resistance value detecting circuit 21a and a programming circuit 22a.

The bias applying/resistance value detecting circuit 21a includes transistors M1 to M5 and a reference resistance element Rref, and has unified together a circuit to apply a voltage not less than a power supply voltage Vdd of the reconfigurable logic circuit 10 across both ends of the resistance change element Rmon, and a circuit to detect a resistance value. The resistance change element Rmon has a first electrode connected to a second node n2, while having a second electrode connected to a first node n1. A signal /MPRO is delivered to each of the gate terminals of transistors M1, M2. The transistor M1 has a first terminal connected to the grounding potential, while having a second terminal connected to a first terminal of the reference resistance element Rref. The transistor M2 has a first terminal connected to the grounding potential, while having a second terminal connected to the node n1. The transistor M3 has a first terminal connected to its gate terminal and to a second terminal of the reference resistance element Rref. The transistor M4 has its gate terminal connected to the gate terminal of the transistor M3, while having s first terminal connected to the second node n2. The transistor M5 has its first terminal connected to the second terminal of the transistor M3 and to the second terminal of the transistor M4, while having its second terminal connected to a power supply potential Vdh. A signal MPRO is delivered to the gate terminal of the transistor M5.

The programming circuit 22a includes transistors M6 to M9 and programs resistance states of the resistance change element Rmon. The transistor M6 has its first terminal connected to a power supply potential Vpro, while having its second terminal connected to the node n2. A signal /MSET is delivered to the gate terminal of the transistor M6. The transistor M7 has its first terminal connected to the node n2, while having its second terminal connected to the grounding potential. A signal MRESET is delivered to the gate terminal of the transistor M7. The transistor M8 has its first terminal connected to the power supply potential Vpro, while having its second terminal connected to the node n1. The signal /MRESET is delivered to the gate terminal of the transistor M8. The transistor M9 has its first terminal connected to the node n1, while having its second terminal connected to the grounding potential. A signal MSET is delivered to the gate terminal of the transistor M9. It is noted that the signal MPRO is given as a logical sum of the signals MRESET and MSET, as indicated at an upper left side of FIG. 3.

The transistors M1, M2 and M5 are on at all times, becoming off only during the time of programming for the resistance change element Rmon.

The resistance value of the reference resistance element Rref is set at a value intermediate between an on-state resistance value (Ron) and an off-state resistance value (Roff) of the resistance change element. For example, if the resistance value Ron=100Ω to 1 kΩ and the resistance value Roff=1MΩ or higher, the resistance value of the reference resistance element Rref is preferably set at say tens to hundreds of kΩ. The reference resistance element Rref can be formed using channel resistances of transistors or by well resistances. The reference resistance element Rref may be formed by series/parallel connections of a plurality of resistance change elements in the on- or off-states.

The transistors M3 and M4 are connected in a current mirror circuit configuration to cause a current Iref that is in keeping with a resistance value of the reference resistance element Rref to flow steadily through the resistance change element Rmon.

When the resistance change element Rmon is in on-state, scarcely any voltage is applied across both ends of the resistance change element Rmon or across the terminals n1 and n2. Hence, the terminal n2 is ca. at 0V, so that an H-level is output at the output terminal MON. If, on the other hand, the resistance change element Rmon is off, a high voltage is applied across both ends of the resistance change element Rmon. The terminal n2 is thus at an H-level, so that an L-level is output at the output terminal MON.

In the resistance value monitor circuit 20, it is possible to detect the timing of change of the resistance change elements used in the reconfigurable logic circuit 10 from the off-states to the on-states to forestall retention failures of the resistance change elements. Thus, in order to help promote the occurrence of an off-state retention failure of the resistance change element Rmon, the polarity of the voltage across both ends of the resistance change element is set so as to be the same as the bias direction during the set operation. That is, the lower electrode (first electrode) of the resistance change element Rmon is connected to the terminal n2, while the upper electrode (second electrode) thereof is connected to the terminal n1.

On the other hand, it is desirable that the resistance change element Rmon, used in the resistance value monitor circuit 20, is susceptible to retention failure at a higher probability than the reference resistance elements used in the reconfigurable logic circuit 10. It is thus desirable that a voltage higher than the power supply voltage Vdd of the reconfigurable logic circuit 10 is applied across both ends of the resistance change element Rmon. The power supply voltage Vdh of the resistance value monitor circuit 20 is set so as to be higher than the power supply voltage Vdd of the reconfigurable logic circuit 10, for example, whereby it is possible to set the voltage applied across both ends of the resistance change element Rmon so as to be higher than the power supply voltage Vdd of the reconfigurable logic circuit 10.

The operation of programming the resistance change element Rmon in the resistance value monitor circuit 20a shown in FIG. 3 will now be explained. It is sufficient that, with the programming operation in the resistance value monitor circuit 20a, the resistance change element Rmon can be set in advance to its off-state (reset operation). However, to decide whether or not the resistance change element Rmon is a failed element, FIG. 3 shows such a resistance value monitor circuit that is able to perform a set operation as well.

To decrease the resistance of the resistance change element Rmon, the signal MSET is brought to H-level, with the signal /MSET being at L-level, such as to turn the transistors M6 and M9 on. In this case, the signal MPRO is at H-level, with /MPRO being at L-level. Hence, the transistors M1, M2 and M5 are off. If the power supply voltage Vpro of the programming circuit 22a is made higher than the set voltage, such as 3V or higher, a set voltage (up to ca. 3V) is applied in a forward direction across the terminals n2 and n1, so that the resistance change element Rmon transitions from the off-state to the on-state.

If conversely the resistance of the resistance change element Rmon is to be increased, the signal MRESET is brought High in level, with /MRESET being at L-level, thereby turning the transistors M7 and M8 on. In this case, the transistors M1, M2 and M5 are off. If the power supply voltage Vpro is made equal to or higher than the reset voltage, such as 3V or higher, a reset voltage is applied in a reverse direction across the terminals n2 and n1, so that the resistance change element Rmon transitions from the on-state to the off-state.

In this manner, the programming voltage is higher than the power supply voltage Vdd (up to 1V) of the reconfigurable logic circuit 10. It is thus desirable that high withstand voltage transistors are used as the transistors used in the resistance value monitor circuit 20a. The transistor M5 may be a high withstand voltage transistor, with the transistors M1 to M4 being core transistors.

Figure 4:
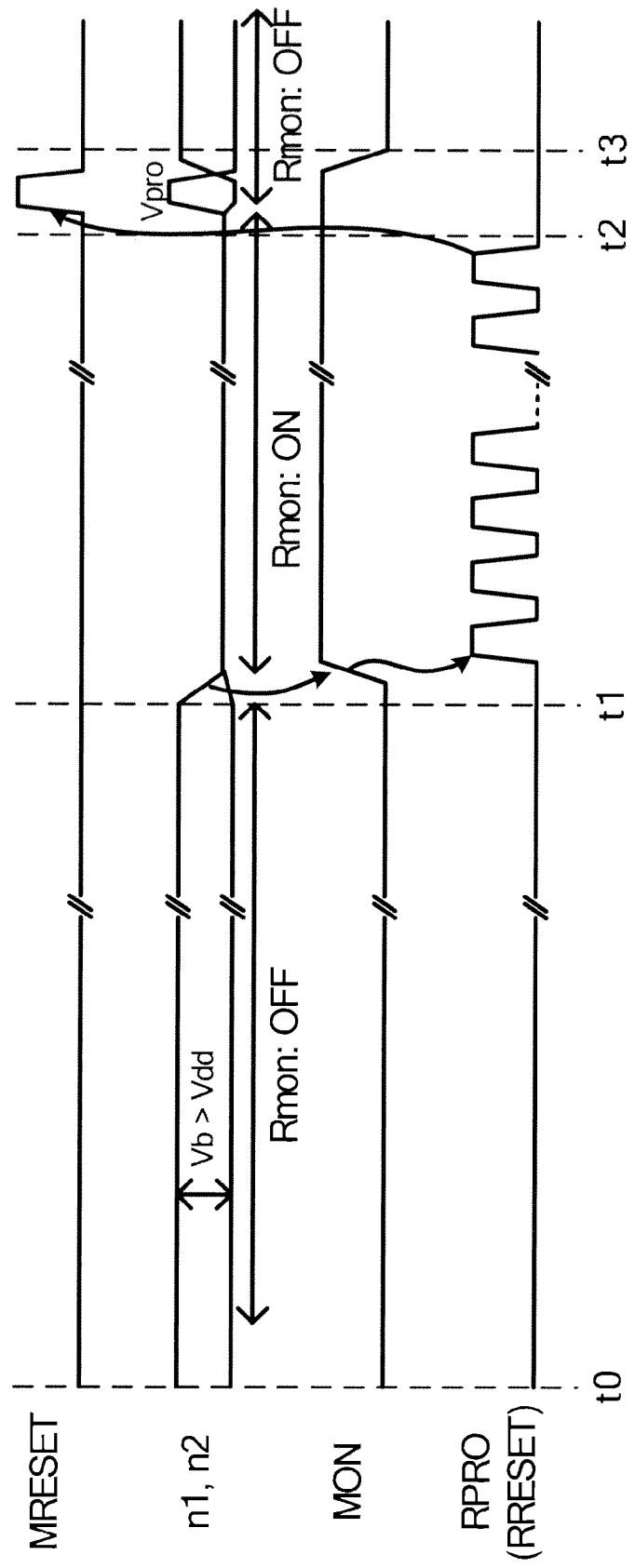
FIG. 4 is a timing chart showing the example refresh operation of the semiconductor device according to the first exemplary embodiment.

FIG. 4 depicts a timing chart showing a refresh operation of the semiconductor device of the present exemplary embodiment. Specifically, the timing chart of FIG. 4 is for the use state and is based on the flowchart of FIG. 2. It is assumed that the resistance change element Rmon has been programmed to an off-state at the time of shipment.

A time point t1 denotes such a time point the resistance change element Rmon of the resistance value monitor circuit 20 has changed to an on-state. That is, the signal MON is activated, that is, goes High in level, at a time point t1, thus initiating the refresh operation. In FIG. 4, the manner in which the states of the resistance change elements Rx used in the reconfigurable logic circuit 10 are detected to execute the reset operation when these elements are in off-states is represented, for convenience in the explanation, by a programming signal during the time of the refresh operation RPRO (=reset signal).

At time point t2, accessing to the total of the resistance change elements comes to a close. The operation is ended by executing the reset operation for the resistance change element Rmon of the resistance value monitor circuit 20 (time points t2 to t3).

The method of accessing the resistance change elements Rx of the reconfigurable logic circuit 10 during the time of the refresh operation (state detection method) will now be explained with reference to FIGS. 5 and 6.

Figure 5:
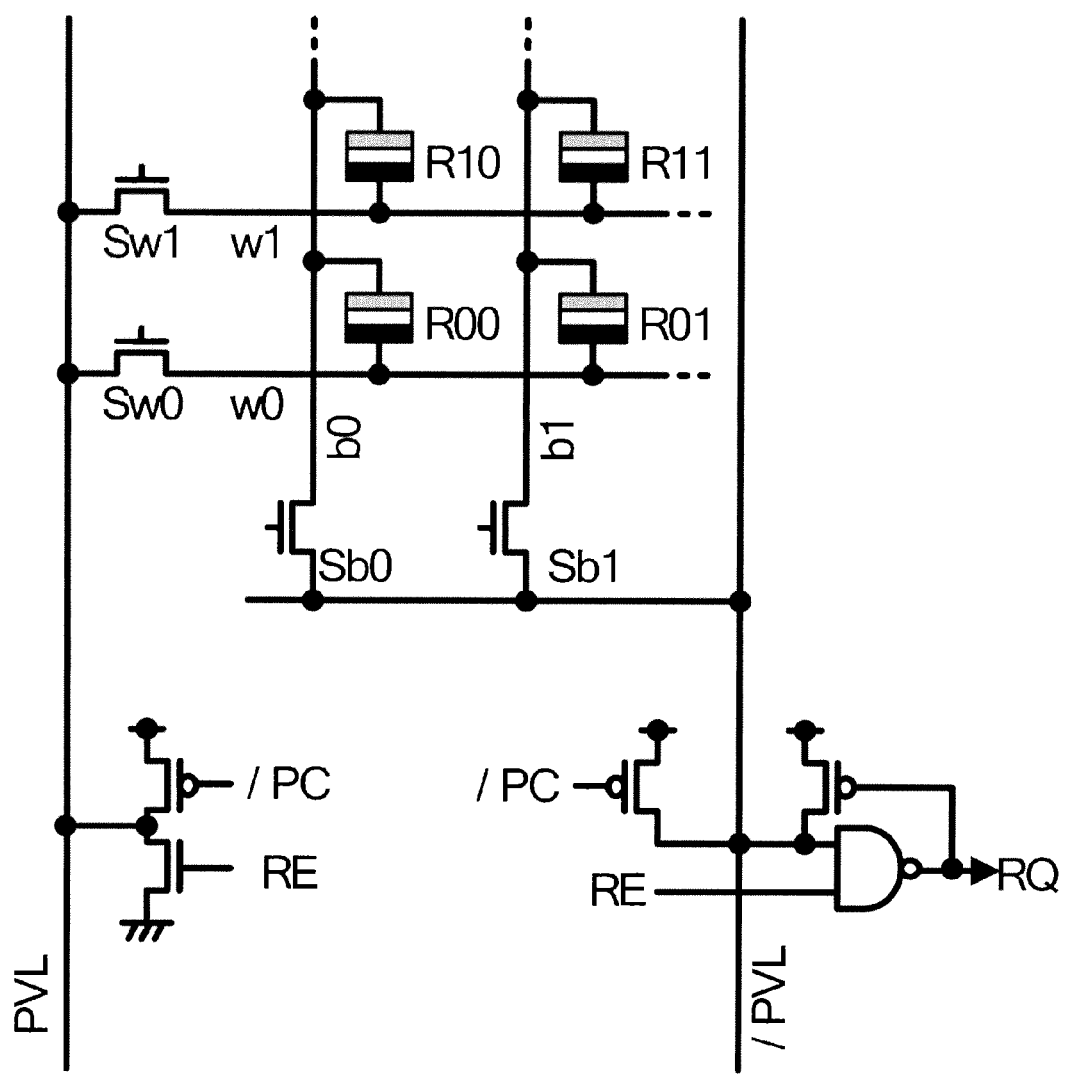
FIG. 5 is a circuit diagram showing an example circuit to detect the resistance state of a resistance change element.
Figure 6:
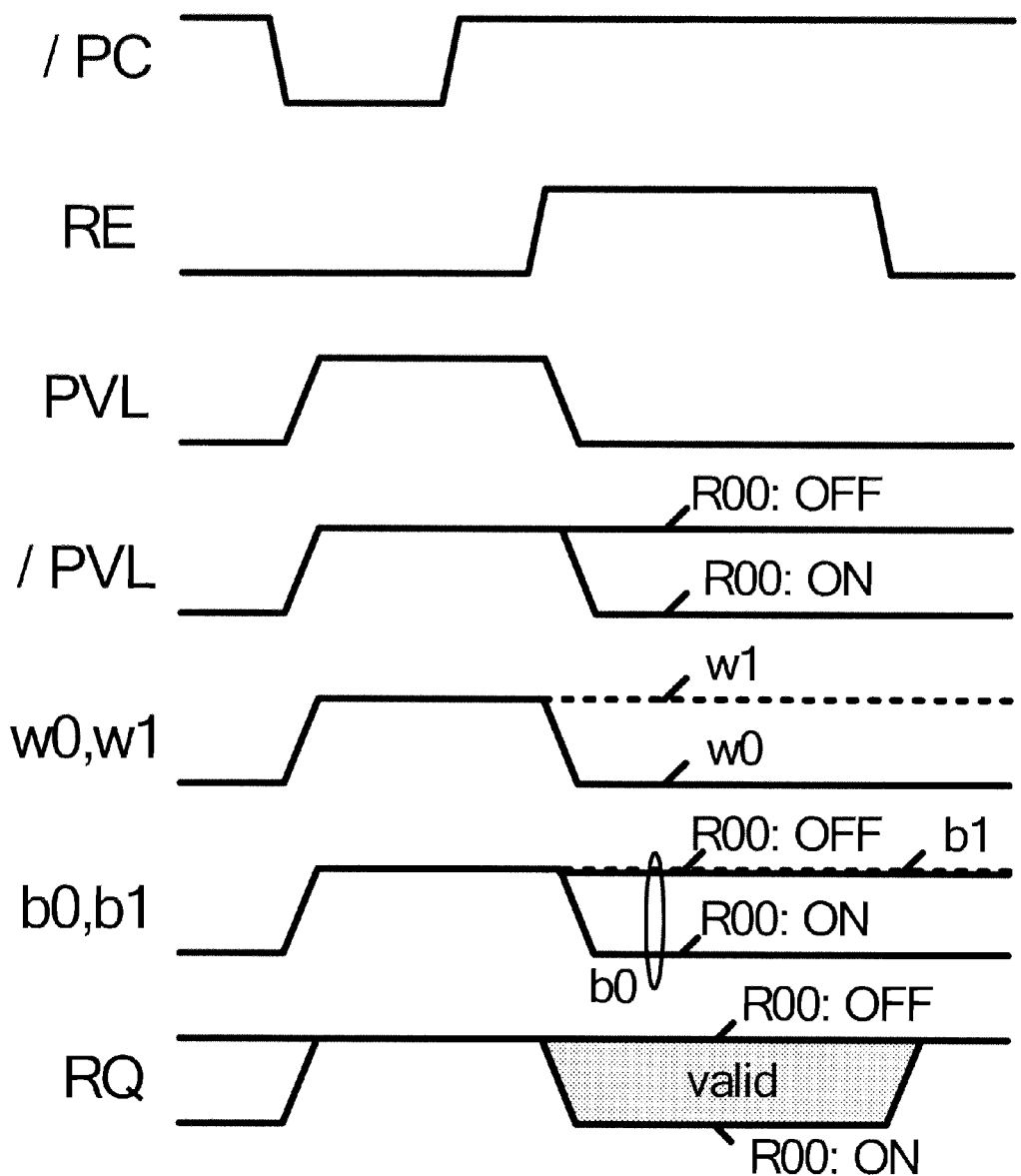
FIG. 6 is a timing chart showing an example operation of the resistance state detection circuit of FIG. 5.

FIG. 5 depicts a circuit diagram showing an example circuit to detect resistance states of the resistance change elements. FIG. 5 shows such example circuit in which resistance change elements R00, R10, R01 and R11 are connected as a crossbar switch of a matrix configuration to interconnections w0, w1, b0 and b1 as used in the logic circuit. A lower electrode (first electrode) of each resistance change element is connected to the interconnection w0 or w1, while its upper electrode (second electrode) is connected to the interconnection b0 or b1.

A circuit-related constraint is now provided that only one resistance change element in each of the columns or rows of the cross-bar switch may be turned on. FIG. 5 shows a 2×2 cross-bar switch as an example. However, if cross-bar switches of the size of 8×8, 16×16 or still larger sizes are used, the operating principle is the same.

With reference to FIG. 5, such a case where the resistance change element R00, connected to the interconnections w0 and b0, is accessed, will now be explained. The method of accessing the resistance change element is carried out in two stages, that is, during the pre-charging period and during the evaluation period (resistance value detection period).

During the pre-charging period, the total of the interconnections of the crossbar switch being accessed are precharged to an H-level. That is, the terminals of the total of the resistance change elements are H in level, with the potential across the ends of each resistance change element being 0V. Specifically, a precharging signal /PC is activated (goes L in level), so that programming lines PVL, /PVL are precharged to the H level. At this time, NMOS switches Sw0, Sw1, connected to the programming line PVL and to the interconnections w0, w1, are all turned on to precharge the interconnections w0, w1 to an H-level. At the same time, NMOS switches Sb0, Sb1, connected to the programming line /PVL and to the interconnections b0, b1, are all turned on to precharge the interconnections b0, b1 to an H-level.

A read-enable signal RE then is activated, that is, goes High in level, so that the period is now the evaluation period. During the evaluation period, only the NMOS switches Sw0, Sb0 of the interconnections w0, b0, connected to the resistance change element R00 being accessed, are turned on, while the remaining resistance change elements are all turned off. Since the programming line PVL is grounded at this time, the interconnection w0 is at L-level.

In case the resistance change element R00 is in an on-state, electrical charges stored in the interconnection b0 by charging are removed by discharging, as a result of which the programming line PVL also goes Low in level. If conversely the resistance change element R00 is in an off-state, the charges stored in the interconnection b0 remain stored by charging. The programming line /PVL remains High in level. The state of the resistance change element R00 in the selected state may thus be detected based on the voltage of the programming line /PVL (FIG. 6).

The above described accessing method will now be scrutinized in connection with the dependency on the resistance states of the non-selected elements (resistance change elements R00, R01 and R11). In case the selected element (resistance change element R00) is on, such state may be detected correctly without dependency on the resistance states of the non-selected elements. It is therefore at issue whether or not the off-state of the selected element (resistance change element R00) can be detected without dependency on data patterns of the non-selected elements.

The resistance change element R00 can be detected to be in off-state in case all of the non-selected elements are off, as will be apparent from the above description.

In case the non-selected element R10 is on and the non-selected elements R01, R11 are off, the interconnections b0 and w1 are interconnected. However, the NMOS switch Sw1 and the resistance change element R11 are in the off-states and hence do not affect the charging/discharging of the interconnection b0. It is thus possible to correctly detect the off-state of the selection element R00.

In case the non-selected element R11 is on and the non-selected elements R10, R11 are off, the interconnections b1 and w0 are interconnected. However, the NMOS switch Sb1 is in the off-state and hence does not affect the charging/discharging of the interconnection b0. It is thus possible to correctly detect the off-state of the selection element R00.

In case the non-selected element R11 is on and the non-selected elements R10, R01 are off, the interconnections b1 and w1 are interconnected. However, the resistance change element R10 is in the off-state and hence does not affect the charging/discharging of the interconnection b0. It is thus possible to correctly detect the off-state of the selection element R00.

In case the non-selected elements R10, R11 are on and the non-selected element R01 is off, the interconnections b0, b1 and w1 are interconnected. However, the NMOS switch Sw1 and the resistance change element R01 are in the off-states and hence do not affect the charging/ discharging of the interconnection b0. It is thus possible to correctly detect the off-state of the selection element R00.

In case the non-selected elements R01, R11 are on and the non-selected element R10 is off, the interconnection b1 is connected to the interconnections w0, w1. However, the resistance change element R10 is in the off-state and hence does not affect the charging/discharging of the interconnection b0. It is thus possible to correctly detect the off-state of the selection element R00.

In case the non-selected elements R10, R01 are on and the non-selected element R11 is off, the interconnections b0 and w1 are interconnected, while the interconnections b1 and w0 are interconnected. However, the resistance change element R11 is in the off-state and hence does not affect the charging/discharging of the interconnection b0.

In case the non-selected elements are all in on-states, the total of the interconnections are interconnected. That is, even though the resistance change element R00 is off, a leakage path b0-R10-w1-R11-b1-R01-w0 is formed, so that the charges on the interconnection b0 are removed by discharging. Hence, the off-state of the selected element R00 may not be detected correctly. However, given the constraint that only one resistance change element may be connected to a single column or a single row of the cross-bar switch, as described above, the above case may not be allowed to take place.

Figure 7:
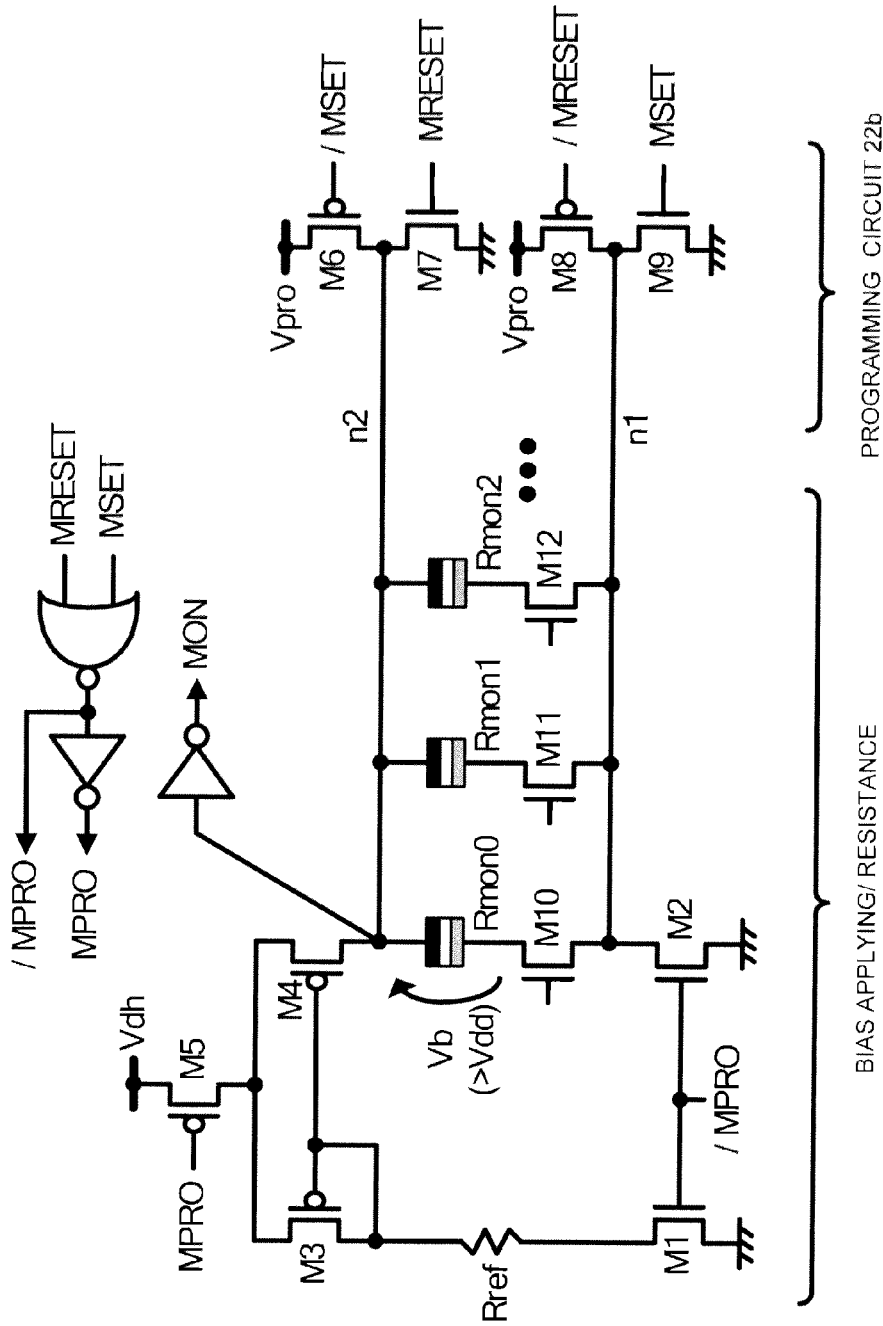
FIG. 7 is a circuit diagram showing another example configuration of the resistance value monitor circuit according to the first exemplary embodiment.

Although the semiconductor device of the exemplary embodiment has been described in detail, the configuration shown above may be changed as desired within the scope of the technical concept of the present invention. FIG. 7 depicts a circuit diagram showing another example configuration of a resistance value monitor circuit 20 in the semiconductor device according to the present exemplary embodiment. The resistance value monitor circuit 20a, shown in FIG. 3, may be changed to a resistance value monitor circuit 20b configured as shown in FIG. 7. In the resistance value monitor circuit 20b, shown in FIG. 7, a plurality of monitor resistance change elements Rmon0 to Rmon2 are connected in parallel to one another to improve the accuracy in the detection of resistance change to the on-state. A plurality of transistors M10 to M12 also possess the function to be turned on during the time of the normal operation to select an arbitrary one of the resistance change elements for the programming operation.

(Second Exemplary Embodiment)

A semiconductor device according to a second exemplary embodiment will now be described with reference to the drawings.

Figure 8:
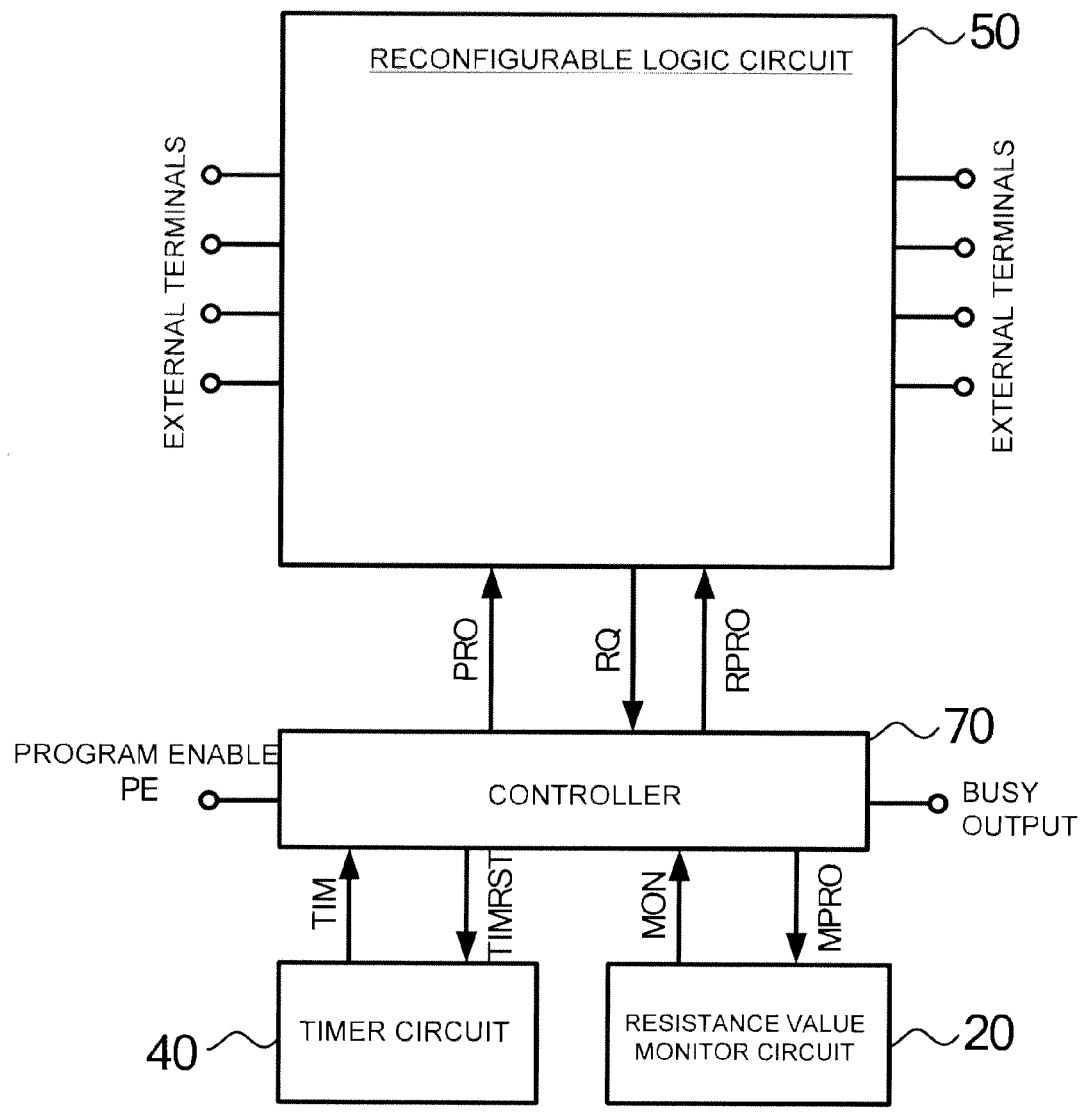
FIG. 8 is a block diagram showing an example configuration of a semiconductor device according to a second exemplary embodiment.

FIG. 8 depicts a block diagram showing the configuration of a semiconductor device according to the second exemplary embodiment. Referring to FIG. 8, the semiconductor device of the present exemplary embodiment includes, similarly to the semiconductor device of the first exemplary embodiment shown in FIGS. 1, 3, 5 and 7), a reconfigurable logic circuit 50, a resistance value monitor circuit 20 and a controller 70. Note that the semiconductor device of the present exemplary embodiment differs from the semiconductor device of the first exemplary embodiment in further including a timer circuit 40.

Referring to FIG. 8, a signal TM is such a signal for a timer to inform that the time on the timer is now the pre-set refresh operation initiation time. A signal TIMRST is such a signal that resets a timer time. The refresh operation initiation time stands for cumulative time of application of the supply power to the subject semiconductor device. That is, the refresh operation initiation time is equivalent to the time during which a voltage equal to the power supply voltage equal to ca. 1V has continued to be applied to both ends of the resistance change element in the off-state used in a reconfigurable logic circuit 50. The setting value of the refresh operation initiation time may, for example, be one hour to one year depending on the system specification or on the retention characteristics of the resistance change element.

Figure 9:
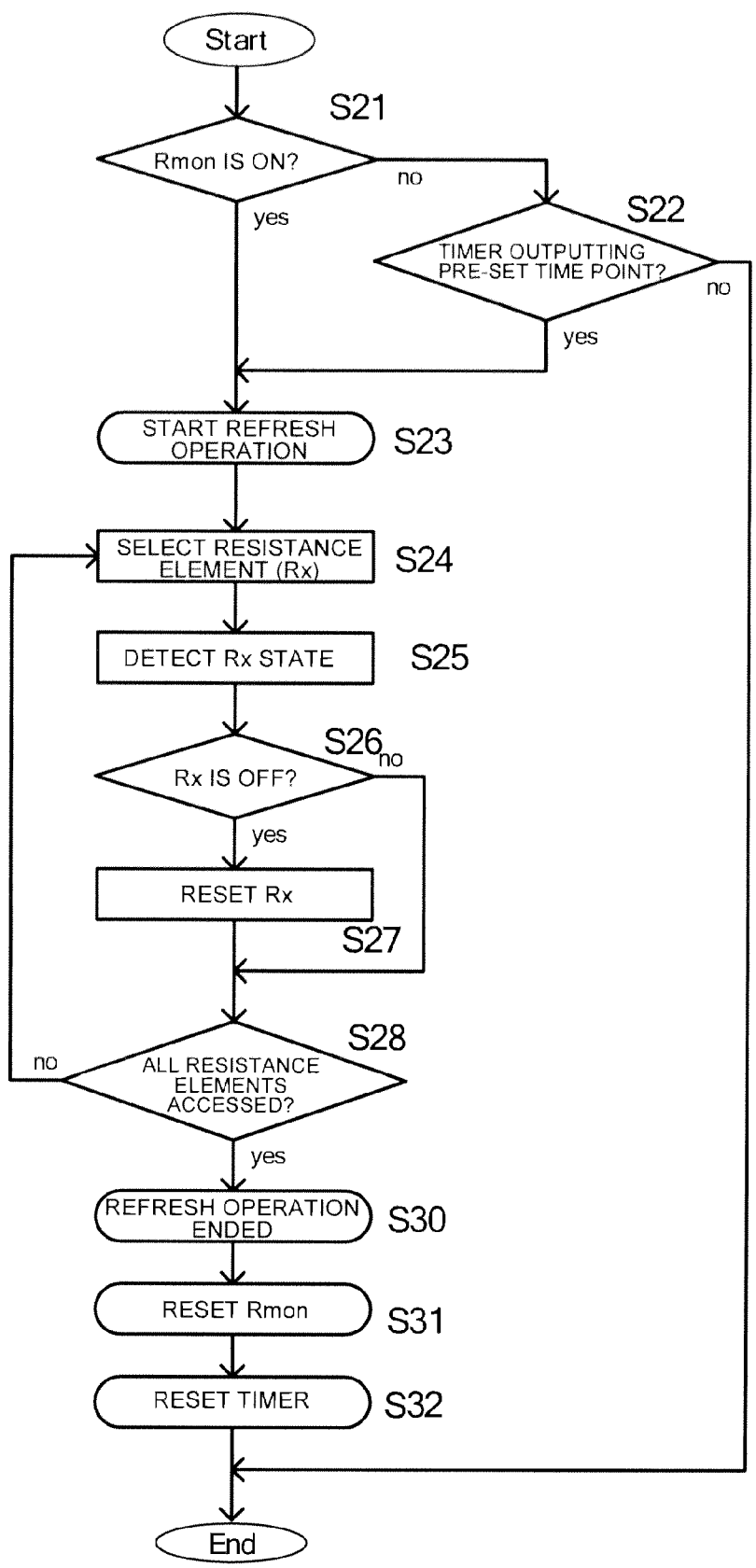
FIG. 9 is a flowchart showing an example refresh operation of the semiconductor device according to the second exemplary embodiment.
Figure 10:
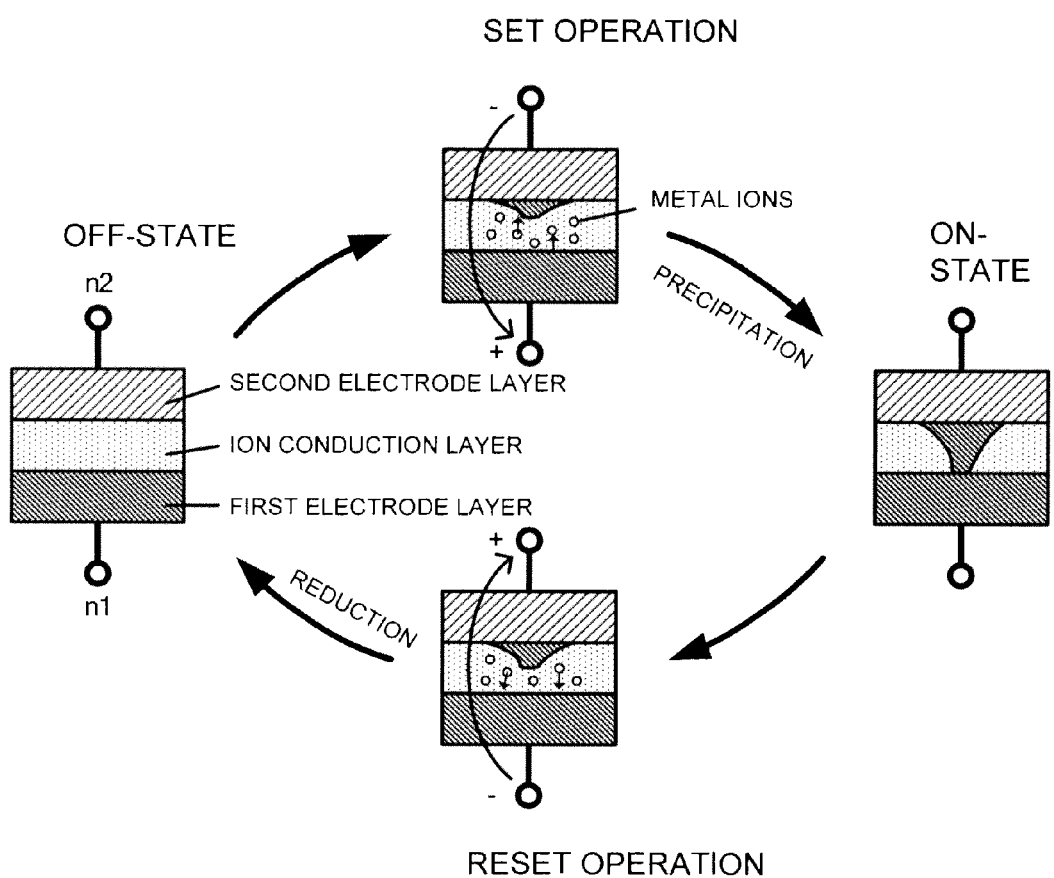
FIG. 10 is a schematic view for illustrating the programming operation for the resistance change clement exploiting a solid electrolyte.
Figure 11:
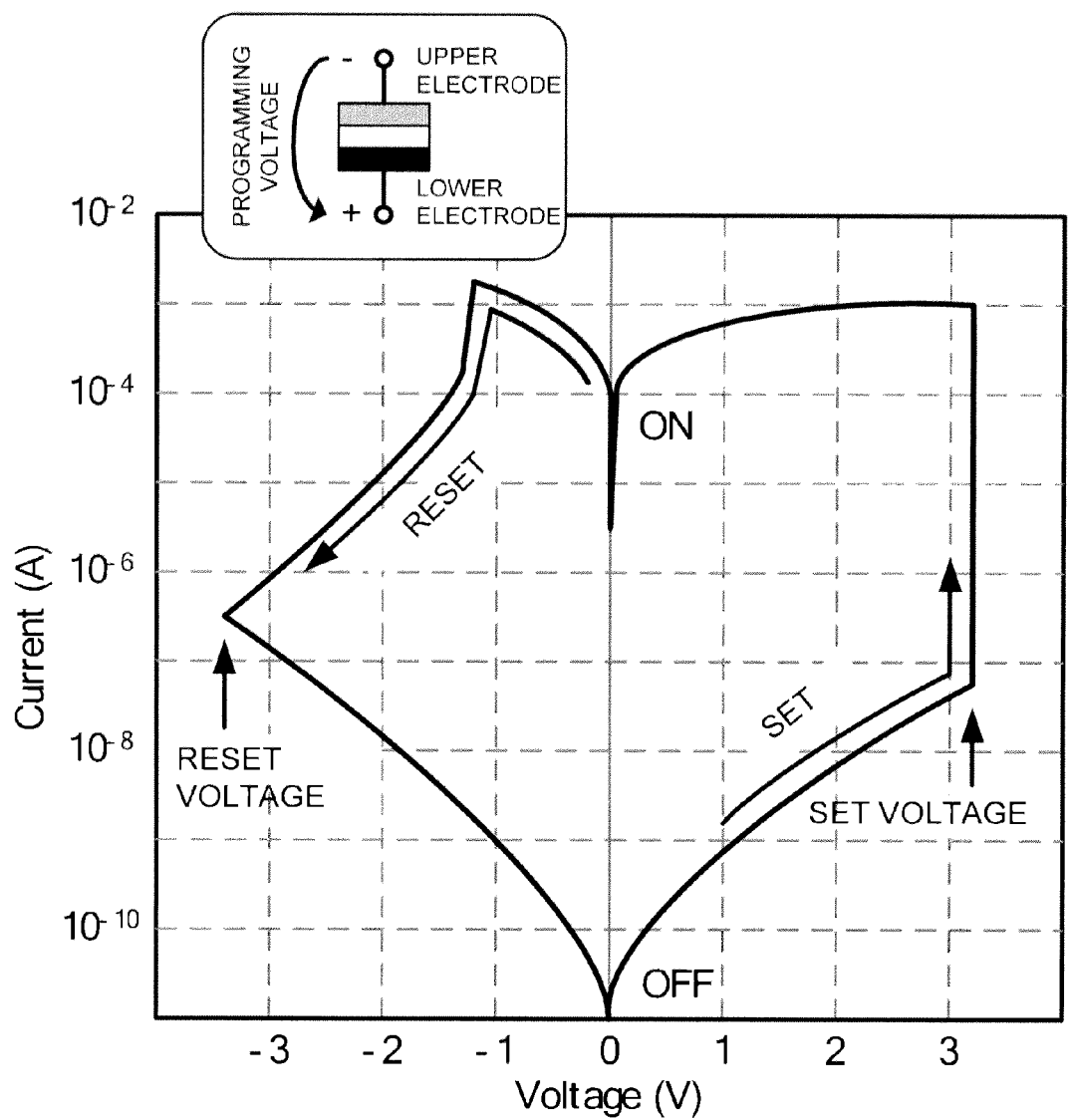
FIG. 11 is a graph showing an example programming characteristic of the resistance change element exploiting the solid electrolyte.

FIG. 9 depicts a flowchart showing a refresh operation of a semiconductor device according to the present exemplary embodiment. With reference to FIG. 9, the refresh operation in the semiconductor device of the present exemplary embodiment will be explained in detail. In the present exemplary embodiment, not only the resistance states of the monitor resistance change element but also the timer information is used as a trigger for initiating the refresh operation.

With reference to FIG. 9, if it is detected that the resistance change element Rmon has transitioned from the off-state to an on-state (Yes of step S21), the refresh operation is initiated, as in the first exemplary embodiment, regardless of the timer information (step S23).

If the resistance change element Rmon has not transitioned to the on-state (No of the step S21), but the timer circuit has detected that time is now the power supply throw cumulative time (Yes of step S22), the refresh operation is initiated (step S23).

The method of accessing each resistance change element and the re-programming operation (re-reset operation) in the refresh operation (steps S24 to S28) are similar to those in the semiconductor device of the first exemplary embodiment (steps S3 to S8 of FIG. 2).

When the accessing to the total of the resistance change elements is ended (Yes of step S28), the refresh operation is ended (step S30), and the operation of re-resetting for the monitor resistance change element Rmon (step S31) and the operation of timer reset (step S32) are performed. It is noted that, if calculations are being executed in the reconfigurable logic circuit 50, the subject refresh operation is preferably initiated after the processing of the calculations is ended and the standby state has been set. This, however, is not shown explicitly in FIG. 9. Moreover, if once the refresh operation is initiated, it is preferred that a busy signal to outside is activated so as not to accept commands from outside. The controller 70 controls the above mentioned sequence of the refresh operations.

It is necessary that a timer circuit 40 to store the power supply throw cumulative time is volatile. The timer circuit 40 may be provided with a counter that cumulatively counts clocks entered from outside. That is, an output value of the counter, equivalent to the power supply throw cumulative time, is preferably transferred to and stored in an inner or outer non-volatile memory when the supply power is turned off. The timer circuit 40 may also have on board a non-volatile memory that uses resistance change elements, and a count value may then be stored at certain addresses in the memory. The timer circuit 40 may also be provided with a resistance change element in which to write the count value when the supply power is turned off.

The disclosure of the above Patent Literatures is incorporated herein by reference thereto. Modifications and adjustments of the exemplary embodiments are possible within the scope of the overall disclosure (including the claims) of the present invention and based on the basic technical concept of the present invention. Various combinations and selections of various disclosed elements (including each element of each claim, each element of each exemplary embodiment, each element of each drawing, etc.) are possible within the scope of the claims of the present invention. That is, the present invention of course includes various variations and modifications that could be made by those skilled in the art according to the overall disclosure including the claims and the technical concept. Particularly, any numerical range disclosed herein should be interpreted that any intermediate values or sub-ranges falling within the disclosed range are also concretely disclosed even without specific recital thereof.

For example, the refresh operation in which the states of the total of the resistance change elements used in the reconfigurable logic circuit are detected and re-reset may be configured by design change so that the refresh operation will be executed by commands from outside.

It is noted that part or all of the above mentioned exemplary embodiments may be stated by the following supplementary notes, albeit in a non-limiting way.

(Supplementary Note 1)

A semiconductor device, comprising:
a reconfigurable logic circuit that includes a plurality of resistance change elements; a logical configuration of the reconfigurable logic circuit being decided depending on whether each of the plurality of resistance change elements is in a first resistance state or in a second resistance state whose resistance value is lower than a resistance value of the first resistance state;

a resistance value monitor circuit that includes a resistance change element pre-programmed to the first resistance state; the resistance value monitor circuit detecting whether or not the pre-programmed resistance change element retains the first resistance state; and a controller that, in case it is detected that the resistance change element provided in the resistance value monitor circuit doe not retain the first resistance state, applies a voltage used in programming from the second resistance state to the first resistance state to a resistance change element retaining the first resistance states, out of the plurality of resistance change elements provided in the reconfigurable logic circuit.

(Supplementary Note 2)

The semiconductor device according to supplementary note 1, wherein each of the plurality of resistance change elements provided in the reconfigurable logic circuit and the resistance change element provided in the resistance value monitor circuit is programmed from the first resistance state to the second low resistance state when a first voltage is applied in a forward direction across both ends thereof, and each of the plurality of resistance change elements in the reconfigurable logic circuit and the resistance change element in the resistance value monitor circuit is programmed from the second resistance state to the first resistance state when a second voltage is applied in a reverse direction across both ends thereof.

(Supplementary Note 3)

The semiconductor device according to supplementary note 1 or 2, comprising:

as the resistance change element provided in the resistance value monitor circuit, a plurality of resistance change elements connected in parallel.

(Supplementary Note 4)

The semiconductor device according to supplementary note 2 or 3, wherein a voltage higher than a power supply voltage of the reconfigurable logic circuit and lower than the first voltage is applied in the forward direction across both ends of the resistance change element provided in the resistance value monitor circuit.

(Supplementary Note 5)

The semiconductor device according to any one of supplementary notes 1 to 4, wherein if it is detected that the resistance change element provided in the resistance value monitor circuit does not retain the first resistance state, the controller applies a voltage used in programming from the second resistance state to the first resistance state to the resistance change element in the resistance value monitor circuit.

(Supplementary Note 6)

The semiconductor device according to any one of supplementary notes 1 to 5, further comprising:

a timer circuit that measures a cumulative time that elapses since supply power throw, wherein the controller applies, if the cumulative time exceeds a pre-set time, a voltage used in programming from the second resistance state to the first resistance state, to a resistance change element retaining the first resistance state out of the plurality of resistance change elements in the reconfigurable logic circuit.

(Supplementary Note 7)

The semiconductor device according to supplementary note 6, wherein if the cumulative time exceeds the pre-set time, the controller applies a voltage used in programming from the second resistance state to the first resistance state to a resistance change element retaining the first resistance state out of the plurality of resistance change elements in the reconfigurable logic circuit, even in case it has been detected that the resistance change element provided in the resistance value monitor circuit retains the first resistance state.

(Supplementary Note 8)

The semiconductor device according to supplementary note 6 or 7, wherein the timer circuit includes a resistance change element that records information corresponding to the cumulative time when the supply power is turned off.

(Supplementary Note 9)

A semiconductor device control method, comprising:

deciding a logical configuration of a reconfigurable logic circuit that includes a plurality of resistance change elements, depending on whether each of the plurality of resistance change elements is in a first resistance state or in a second resistance state whose resistance value is lower than a resistance value of the first resistance state;

detecting whether or not a resistance change element in a resistance value monitor circuit, pre-programmed to the first resistance state, retains the first resistance state; and applying, in case it is detected that the resistance change element provided in the resistance value monitor circuit does not retain the first resistance state, a voltage used in programming from the second resistance state to the first resistance state to a resistance change element retaining the first resistance states, out of the plurality of resistance change elements provided in the reconfigurable logic circuit.

(Supplementary Note 10)

The semiconductor device control method according to supplementary note 9, wherein each of the plurality of resistance change elements provided in the reconfigurable logic circuit and the resistance change element provided in the resistance value monitor circuit is programmed from the first resistance state to the second resistance state when a first voltage is applied in a forward direction across both ends thereof, and each of the plurality of resistance change elements in the reconfigurable logic circuit and the resistance change element in the resistance value monitor circuit is programmed from the second resistance state to the first resistance state when a second voltage is applied in a reverse direction across both ends thereof.

(Supplementary Note 11)

The semiconductor device control method according to supplementary note 10, wherein a voltage higher than a power supply voltage of the reconfigurable logic circuit and lower than the first voltage is applied in the forward direction across both ends of the resistance change element provided in the resistance value monitor circuit.

(Supplementary Note 12)

The semiconductor device control method according to any one of supplementary notes 9 to 11, wherein if it is detected that the resistance change element provided in the resistance value monitor circuit does not retain the first resistance state, the controller applies a voltage used in programming from the second resistance state to the first resistance state to the resistance change element provided in the resistance value monitor circuit.

(Supplementary Note 13)

The semiconductor device control method according to any one of supplementary notes 9 to 12, further comprising:

applying, if a cumulative time that elapses since supply power throw exceeds a pre-set time, a voltage used in programming from the second resistance state to the first resistance state, to a resistance change element retaining the first resistance state out of the plurality of resistance change elements in the reconfigurable logic circuit.

10, 50 reconfigurable logic circuit
11 internal power supply circuit
12, 22, 22a, 22b programming circuit
20, 20a, 20b resistance value monitor circuit
21, 21a, 21b bias applying/resistance value detecting circuit
22, 22a, 22b programming circuit
30, 70 controller
40 timer circuit
b0, b1, w0, w1 interconnection
M1~M12 transistor
MON, MPRO, MRESET, MSET, TIMRST, TM signal
PVL, /PVL programming line
RE read-enable signal
RMON, Rmon1~Rmon2, Rx, R00~R11 resistance change element
Rref reference resistance element
Sw0, Sw1, Sb0, Sb1 NMOS switch
Vpro power supply voltage

What is claimed is:

1. A semiconductor device, comprising:
a reconfigurable logic circuit that includes a plurality of resistance change elements; a logical configuration of the reconfigurable logic circuit being decided depending on whether each of the plurality of resistance change elements is in a first resistance state or in a second resistance state whose resistance value is lower than a resistance value of the first resistance state;
a resistance value monitor circuit that includes a resistance change element pre-programmed to the first resistance state; the resistance value monitor circuit detecting whether or not the pre-programmed resistance change element retains the first resistance state; and
a controller that, in case it is detected that the resistance change element provided in the resistance value monitor circuit does not retain the first resistance state, applies a voltage used in programming from the second resistance state to the first resistance state to a resistance change element retaining the first resistance states, out of the plurality of resistance change elements provided in the reconfigurable logic circuit.

2. The semiconductor device according to claim 1, wherein each of the plurality of resistance change elements provided in the reconfigurable logic circuit and the resistance change element provided in the resistance value monitor circuit is programmed from the first resistance state to the second low resistance state when a first voltage is applied in a forward direction across both ends thereof, and each of the plurality of resistance change elements in the reconfigurable logic circuit and the resistance change element in the resistance value monitor circuit is programmed from the second resistance state to the first resistance state when a second voltage is applied in a reverse direction across both ends thereof.

3. The semiconductor device according to claim 1, comprising:
as the resistance change element provided in the resistance value monitor circuit, a plurality of resistance change elements connected in parallel.

4. The semiconductor device according to claim 2, wherein a voltage higher than a power supply voltage of the reconfigurable logic circuit and lower than the first voltage is applied in the forward direction across both ends of the resistance change element provided in the resistance value monitor circuit.

5. The semiconductor device according to claim 1, wherein if it is detected that the resistance change element provided in the resistance value monitor circuit does not retain the first resistance state, the controller applies a voltage used in programming from the second resistance state to the first resistance state to the resistance change element in the resistance value monitor circuit.

6. The semiconductor device according to claim 1, further comprising:
a timer circuit that measures a cumulative time that elapses since supply power throw, wherein
the controller applies, if the cumulative time exceeds a pre-set time, a voltage used in programming from the second resistance state to the first resistance state, to a resistance change element retaining the first resistance state out of the plurality of resistance change elements in the reconfigurable logic circuit.

7. The semiconductor device according to claim 6, wherein if the cumulative time exceeds the pre-set time, the controller applies a voltage used in programming from the second resistance state to the first resistance state to a resistance change element retaining the first resistance state out of the plurality of resistance change elements in the reconfigurable logic circuit, even in case it has been detected that the resistance change element provided in the resistance value monitor circuit retains the first resistance state.

8. The semiconductor device according to claim 6, wherein the timer circuit includes a resistance change element that records information corresponding to the cumulative time when the supply power is turned off.

9. A semiconductor device control method, comprising:
deciding a logical configuration of a reconfigurable logic circuit that includes a plurality of resistance change elements, depending on whether each of the plurality of resistance change elements is in a first resistance state or in a second resistance state whose resistance value is lower than a resistance value of the first resistance state;
detecting whether or not a resistance change element in a resistance value monitor circuit, pre-programmed to the first resistance state, retains the first resistance state; and
applying, in case it is detected that the resistance change element provided in the resistance value monitor circuit does not retain the first resistance state, a voltage used in programming from the second resistance state to the first resistance state to a resistance change element retaining the first resistance states, out of the plurality of resistance change elements provided in the reconfigurable logic circuit.

10. The semiconductor device control method according to claim 9, wherein
each of the plurality of resistance change elements provided in the reconfigurable logic circuit and the resistance change element provided in the resistance value monitor circuit is programmed from the first resistance state to the second resistance state when a first voltage is applied in a forward direction across both ends thereof, and each of the plurality of resistance change elements in the reconfigurable logic circuit and the resistance change element in the resistance value monitor circuit is programmed from the second resistance state to the first resistance state when a second voltage is applied in a reverse direction across both ends thereof.

11. The semiconductor device control method according to claim 10, wherein
a voltage higher than a power supply voltage of the reconfigurable logic circuit and lower than the first voltage is applied in the forward direction across both ends of the resistance change element provided in the resistance value monitor circuit.

12. The semiconductor device control method according to claim 9, wherein if it is detected that the resistance change element provided in the resistance value monitor circuit does not retain the first resistance state, the controller applies a voltage used in programming from the second resistance state to the first resistance state to the resistance change element provided in the resistance value monitor circuit.

13. The semiconductor device control method according to claim 9, further comprising:

applying, if a cumulative time that elapses since supply power throw exceeds a pre-set time, a voltage used in programming from the second resistance state to the first resistance state, to a resistance change element retaining the first resistance state out of the plurality of resistance change elements in the reconfigurable logic circuit.

* * * * *